US005754059A

United States Patent [19]
Tanghe et al.

[11] Patent Number: 5,754,059
[45] Date of Patent: May 19, 1998

[54] MULTI-STAGE ECL-TO-CMOS CONVERTER WITH WIDE DYNAMIC RANGE AND HIGH SYMMETRY

[75] Inventors: Steven J. Tanghe, Essex Junction, Vt.; Gregg R. Castellucci, Plattsburgh, N.Y.

[73] Assignee: International Business Machines Corporation, Armonk, N.Y.

[21] Appl. No.: 782,408

[22] Filed: Jan. 14, 1997

[51] Int. Cl.$^6$ .................................... H03K 19/018
[52] U.S. Cl. ...................... 326/77; 360/67; 326/63
[58] Field of Search .................... 360/46, 65, 66, 360/67, 68; 326/32, 33, 63, 77, 78

[56] References Cited

U.S. PATENT DOCUMENTS

| | | | |
|---|---|---|---|
| 4,906,871 | 3/1990 | Iida | 326/33 |
| 5,327,298 | 7/1994 | Ottensen et al. | 360/46 |
| 5,459,412 | 10/1995 | Mentzer | 326/32 |
| 5,606,464 | 2/1997 | Agazzi et al. | 360/46 |

FOREIGN PATENT DOCUMENTS 4-103216  8/1990  Japan ...................... 326/78

Primary Examiner—Edward P. Westin
Assistant Examiner—Don Le
Attorney, Agent, or Firm—Eugene I. Shkurko

[57] ABSTRACT

A circuit for converting received input signals to highly symmetrical CMOS level outputs having fast slew rates. The circuit can accept a differential input signal with a wide range of common mode voltages. A first stage level shifts the input signals to provide a ground-based common mode output to a second stage level shifter which centers the input signals around the midpoint between $V_{cc}$ and ground and which increases their voltage swing. The final stage provides a full, highly symmetric, rail-to-rail output capable of driving highly capacitive loads at high rates and which is immune to temperature, $V_{cc}$, and process variations.

9 Claims, 5 Drawing Sheets

CONVERTER—PART 1
GROUND-BASED LEVEL SHIFTER/BUFFER

CONVERTER—PART 2
VCC/2-BASED LEVEL SHIFTER/GENERATOR

MULTI-STAGE ECL-TO-CMOS CONVERTER WITH WIDE DYNAMIC RANGE AND HIGH SYMMETRY

BACKGROUND OF THE INVENTION

1. Technical Field of the Invention

This invention pertains to electronic circuits. In particular, this invention is directed to a method and apparatus for converting emitter coupled logic signals to standard single-ended or differential CMOS logic levels having a high slew rate, voltage swing, and symmetry.

2. Background Art

There have been several circuits published that convert positive emitter-coupled logic ("PECL") signals to CMOS levels but which do not provide as fast or as symmetrical an output as the circuit and method of the presently disclosed invention. These advantages are becoming increasingly critical in certain applications such as disk drive write devices where speed and temporal accuracy are essential.

It is an object of the present invention to provide an apparatus to convert ECL signals to standard single-ended or differential CMOS logic levels wherein the outputs are highly symmetrical and switch with a high slew rate.

It is another object of the invention to provide a method of converting ECL signals to standard single-ended or differential CMOS logic levels wherein the outputs are highly symmetrical and switch with a high slew rate.

It is another object of the present invention to provide an apparatus for converting ECL signals to standard single-ended or differential CMOS logic levels wherein the input signals may vary over a very wide range of common mode voltages.

It is yet another object of the present invention to provide an apparatus with the above specified advantages that is also immune to temperature variations, $V_{cc}$ voltage level variations, and to process variations affecting the size characteristics of devices used to build the apparatus.

SUMMARY OF THE INVENTION

An embodiment of the present invention that solves the conversion problem consists primarily of three parts. The first part is essentially a level shifter and buffer. It receives a signal with a relatively small voltage swing, for example 0.5 volts but which may vary, with some positive DC offset and converts the signal to one with a known ground referenced common-mode voltage. This first circuit stage buffers the input signal and insures a uniform ground referenced common-mode voltage output for any ECL input, which can have a wide range of common-mode voltages.

The output of the first stage is ground-based in such a way that it allows the next bipolar stage to maximize its output voltage swing. This conversion is done using a circuit resembling a folded-cascode stage (common in analog circuits), but uniquely modified to accept an input ECL signal with a DC common mode voltage level up to about the positive power rail (see 1 in FIG. 1).

The second stage of the present embodiment converts the ground-based differential PECL signal to a wider-swing signal whose common-mode voltage is centered midway ($V_{cc}/2$) between the positive supply voltage ($V_{cc}$) and ground. This level is chosen because it is, essentially, the switching threshold of the following CMOS output stage. The centering of the signal about $V_{cc}/2$ is accomplished with a novel technique for setting the current in a bipolar differential pair in such a way that it regulates the output voltage at $V_{cc}/2$ independently of $V_{cc}$, temperature, and device process variations.

The third stage of the circuit is a multistage CMOS driver. It is consists of conventional CMOS inverters strung together, whose number depends on the load being driven. This converts the incoming signal (or signals if, differential) from a modest swing (for example, about 2 volts amplitude) to CMOS levels—full swing $V_{cc}$-to-ground. It can be designed, by adding inverter stages, to drive a highly capacitive node at fast rates.

Together, the three components of the present embodiment described above provide a novel apparatus and method that operate at high speeds with excellent symmetry since the signal path comprises mostly bipolar differential emitter-coupled pairs. Other features and advantages of this invention will become apparent from the following detailed description of the presently preferred embodiment of the invention, taken in conjunction with the accompanying drawings.

BEST MODE FOR CARRYING OUT THE INVENTION

Figure 1:
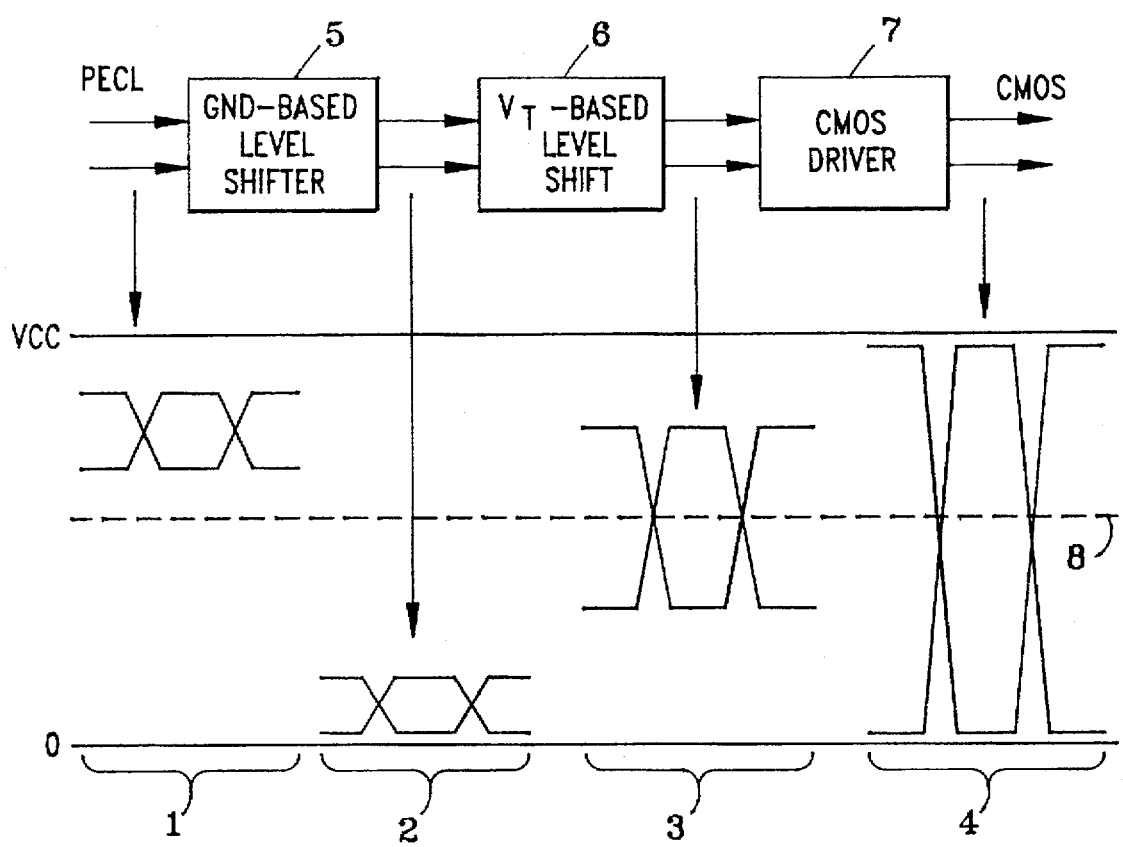
FIG. 1 illustrates the method steps of the present invention.
Figure 5:
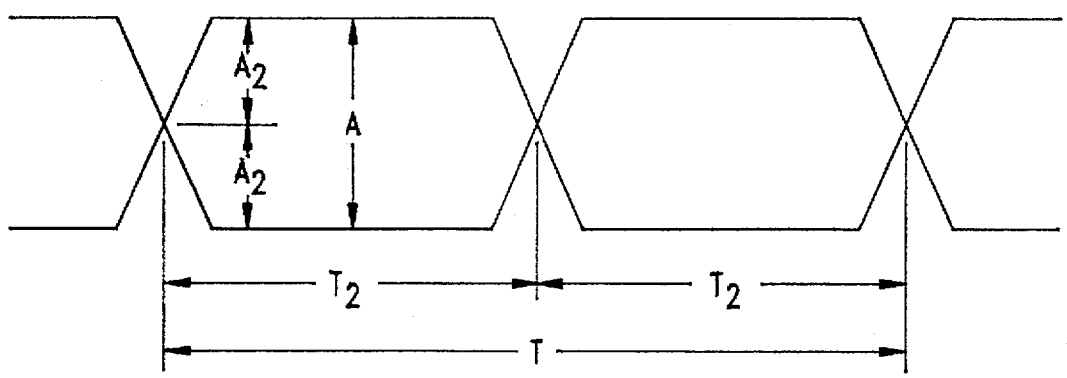
FIG. 5 illustrates characteristics of symmetrical differential signals.

Referring to FIG. 1, wherein the signal levels are not necessarily to scale, illustrated is a three stage method for converting received PECL signals 1 into, first, ground level shifted signals 2. Second, the ground level shifted signals are shifted to a higher common mode voltage 8 about midway between ground and $V_{cc}$, and their voltage amplitude increased 3. Finally, the voltage amplitude is increased to a full rail-to-rail swing 4 suitable for driving CMOS loads. The resulting CMOS output signals have excellent symmetry characteristics as illustrated in FIG. 5 (not to scale) wherein amplitudes $A_2$ are substantially half the full swing A. The cycles as illustrated are referenced from the point at which the illustrated differential signals cross. The amplitude relationship ($A_2=\frac{1}{2}A$) indicates that the signals cross midway between the positive and negative signal peaks.

Figure 2:
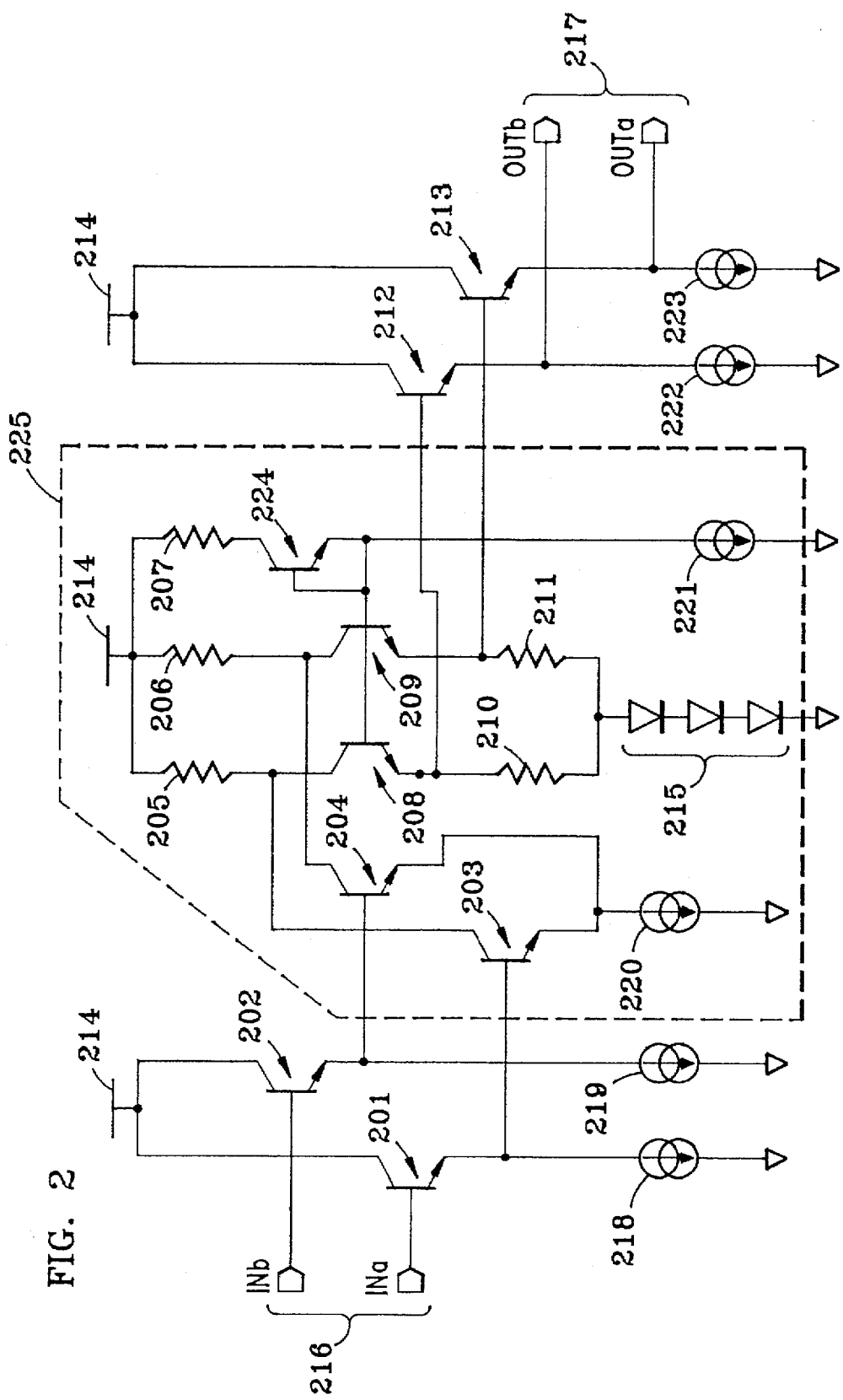
FIG. 2 illustrates a first stage of the apparatus of the present invention.

Referring to FIG. 2, an embodiment of the first stage of the inventive apparatus is shown, coupled to voltage source $V_{cc}$ 214. The first stage receives differential ECL signals at 216, which may not be referenced to any specific voltage level, and replicates these differential signals at outputs 217 referenced to a ground potential, i.e. two diode drops plus a resistor voltage above ground $2 \times V_{be}+IR_1$ (three diodes 215 minus the $V_{be}$ drop of transistor 213 plus resistor 211 voltage for OUTa and, for OUTb, minus the $V_{be}$ drop of transistor 212 plus resistor 210 voltage), and at a level (illustrated in FIG. 1) which provides an optimum operation range for the next stage shifter/generator so that the next stage output is maximized.

Emitter followers 201 and 202, coupled to current sources 218 and 219, buffer the input signals INa and INb. These signals then flow into a part of the circuit 225 which resembles a folded cascode circuit that includes the differential pair 203 and 204 coupled to a common current source 220 and to $V_{cc}$ through resistive loads 205 and 206, respectively. The differential pair, in turn, control current flowing from $V_{cc}$ through the legs comprising transistors 208 and 209, and the ground referenced resistive loads 210 and 211, respectively, which reflect the differential current flowing through the differential pair. Output transistors 212 and 213 are coupled to the resistors 210 and 211, respectively, resulting in the ground-based reference for the output. Resistor 207 and transistor 224, coupled in series to $V_{cc}$ 214 and to ground through current source 221 provide a bias for transistors 208 and 209.

The output includes transistors 212 and 213 both coupled to $V_{cc}$ 214 and to current sources 222 and 223, respectively. It can be seen that the outputs 217 are referenced to ground by three diode drops 215 plus the voltage across resistors 210 and 211 minus the diode drop $V_{be}$ across transistors 212 and 213 for each of the outputs 217, OUTb and OUTa, respectively.

Figure 3:
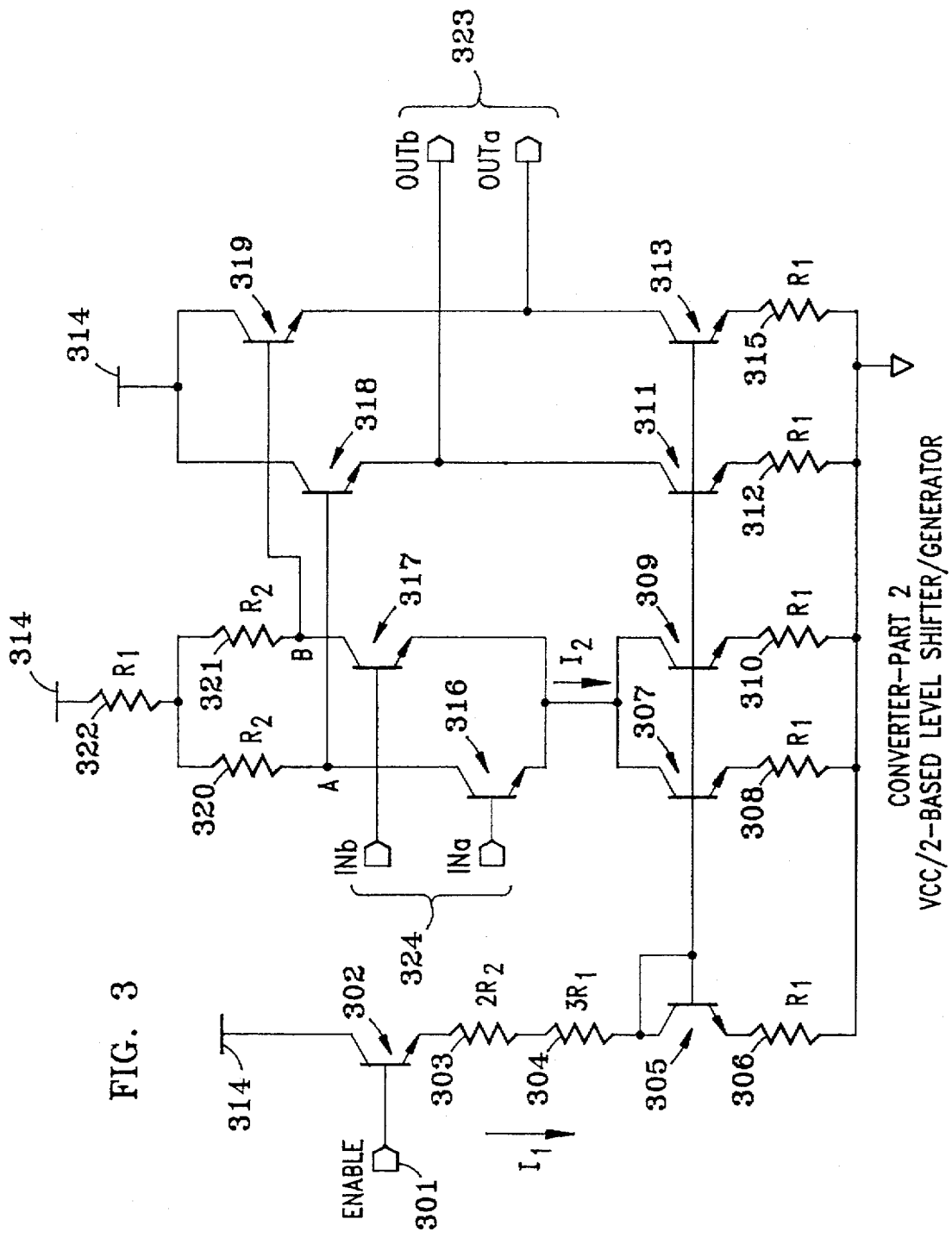
FIG. 3 illustrates a second stage of the apparatus of the present invention.

Referring to FIG. 3, the circuit illustrated converts an input signal to a signal centered around the CMOS driver threshold ($V_{cc}/2$), which is implemented in the next stage of the present embodiment, and increases the voltage swing of the input signal. The output 323 common mode voltage can be calculated by reference to the currents flowing through the first leg $I_1$ and the middle portion $I_2$ of the circuit, prior to the output stage. It can be seen that $I_1$, is equivalent to $(V_{cc}-2V_{be})+(2R_2+4R_1)$, wherein $V_{be}$ is the voltage drop of transistor 302 and of transistor 305. Similarly, with reference to the middle portion of this circuit, $I_2$ can be seen to be equivalent to $(V_{cc}-2V_{be})+(R_2+2R_1)$, wherein transistors 316, 317, 307, and 309 each provide a voltage drop $V_{be}$, and which results in an $I_2$ magnitude twice that of $I_1$. Finally, having the foregoing current proportions, the common mode output voltage $V_{out}$ of output signals 323 can be calculated as follows: $V_{cc}-I_2R_1-\frac{1}{2}I_2R_2-V_{be}=\frac{1}{2}V_{cc}$.

Transistor 302 provides a diode drop $V_{be}$, as do all the transistors in this stage, and can be used to enable/disable the circuit shown in FIG. 3. The differential input signal is received at INb and INa 324 by differential pair 316 and 317. The low ground-based common mode received from the first stage prevents saturation of transistors 316, 317, 307, and 309, while not falling below the active (i.e. turn-off) threshold of these devices, thus, maximizing the voltage swing coming off these devices at nodes A and B (which are also two diode drops plus a resistor voltage above ground). Transistors 307 and 309 mirror the current $I_1$ flowing through transistor 305 and sets the current $I_2$ flowing through the differential pair transistors 316 and 317 combined. Emitter followers 318 and 319 buffer the differential signals coming off nodes A and B, respectively, and provide output signals OUTb and OUTa, respectively, at their emitters at the same frequency as, and corresponding to, the input ECL signals. Current sources are provided by the transistor/resistor pairs 305 and 306, 307 and 308, 309 and 310, 311 and 312, and 313 and 315, for each leg of the circuit as shown.

Figure 4:
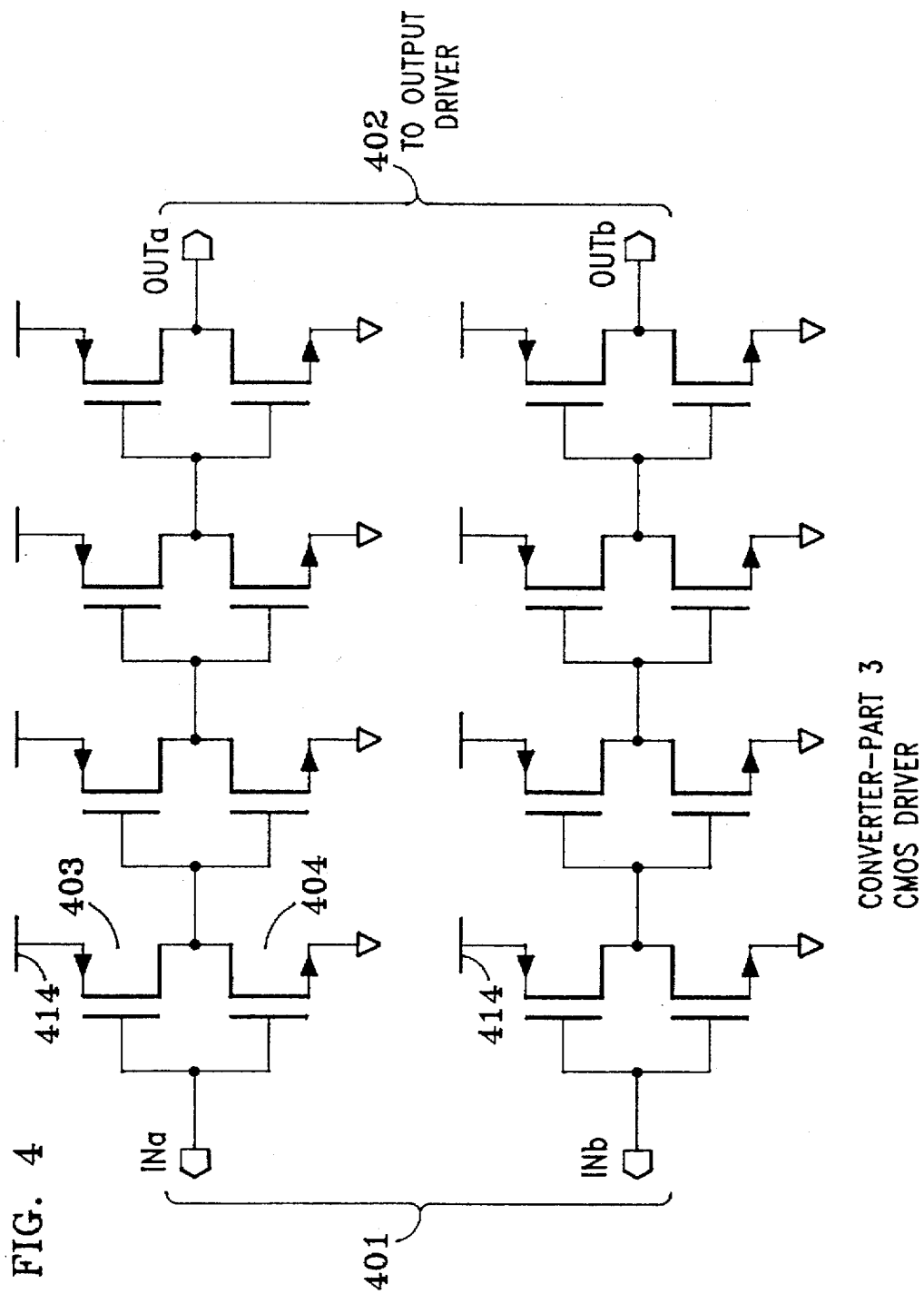
FIG. 4 illustrates a third stage of the apparatus of the present invention.

Referring to FIG. 4, conventional and well-known CMOS drivers, i.e. inverting NFET/PFET pairs, are used for providing output signals to an output driver device, for example, a conventional H-driver circuit, coupled to outputs OUTa and OUTb 402. The output driver device may be coupled, in turn, to a load such as a write head, for example, in a disk storage system (FIG. 6) for driving current pulses through the write head. Inputs INa and INb 401 receive signals (see 3 of FIG. 1) from OUTa and OUTb 323 of FIG. 3. This CMOS output stage amplifies the input signals to a full, rail-to-rail swing (see 4 of FIG. 1). Increasing the number of stages provides better output signal characteristics for greater loads, i.e. faster rise/fall times. The CMOS drivers switch at the threshold $V_{cc}/2$ as described previously. Thus, the preceding level-shifting stage provides a cooperative input for this last stage.

Figure 6:
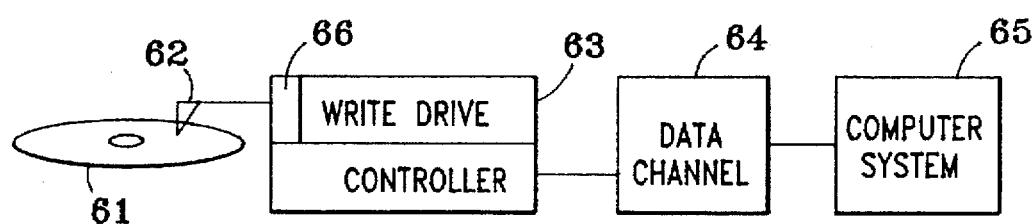
FIG. 6 illustrates a disk storage system embodiment of the present invention.

A storage system implementation of the present invention is illustrated in FIG. 6, wherein current pulses, corresponding to data (signals) to be stored onto magnetic media 61, are efficiently driven through the write head 62 by the circuit of the present invention 63, combined with a conventional output driver 66 as described above. The data to be stored is received over a conventional data channel 64 (coupled to inputs 216 of FIG. 2) and is typically sent from a computer system 65 which might include various forms of an information handling apparatus.

ALTERNATIVE EMBODIMENTS

The matter contained in the above description or shown in the accompanying drawings have been described for purposes of illustration and shall not be interpreted in a limiting sense. It will be appreciated that various modifications may be made in the above structure and method without departing from the scope of the invention described herein. Thus, changes and alternatives will now become apparent to those skilled in the art without departing from the spirit and scope of the invention as set forth in the following claims. Accordingly, the scope of protection of this invention is limited only by the following claims and their equivalents.

What is claimed is:

1. A method comprising the steps of:
   a) receiving an input signal having an amplitude;
   b) level shifting the input signal to a common mode voltage slightly above and referenced to ground;
   c) level shifting the input signal a second time to a common mode voltage substantially halfway between a positive voltage rail and ground including increasing the amplitude of the input signal; and
   d) outputting an output signal corresponding to the input signal and having a swing from about ground to about the positive voltage rail.

2. The method according to claim 1, wherein the common mode voltage slightly above ground is substantially equivalent to about two diode drops plus a resistor voltage above ground.

3. Apparatus comprising:
   receiving means for receiving differential signals each having a voltage swing;
   ground-level shifting means coupled to the receiving means for shifting the common mode level of the received differential signals such that a lowest point of the voltage swing of either of the shifted differential signals is almost at about an activation threshold of following receiving devices, if the lowest point of the voltage swing of either of the received differential signals is not already almost at about the activation threshold; and
   mid-level shifting means, comprising said following receiving devices, coupled to the ground-level shifting means for shifting the common mode level of the received differential signals to about $V_{cc}/2$ where $V_{cc}$ is the positive voltage supply rail for the apparatus.

4. The apparatus according to claim 3, wherein the mid-level shifting means includes means for increasing the voltage swing of the received differential signals.

5. The apparatus according to claim 3 further comprising a multi-stage output driver for increasing the voltage swing of the received differential signals such that the swing ranges from about ground level to about the positive supply voltage rail and for outputting the received differential signals with the increased voltage swing.

6. The apparatus according to claim 5, wherein the differential signals each further have a positive DC offset.

7. A storage system comprising:

a write head for storing data onto a magnetic medium; and a write device coupled to the write head for sending the data to the write head, including:

receiving means for receiving data signals sent over a data channel to the write device, each of the data signals having a voltage swing;

ground-level shifting means coupled to the receiving means for shifting the common mode level of the received data signals to a pre-designed amount above ground, if the lowest point of the voltage swing of the received data signals is not already at the pre-designed amount above ground; and mid-level shifting means coupled to the ground-level shifting means for shifting the common mode level of the received data signals to about $V_{cc}/2$ where $V_{cc}$ is the positive voltage supply rail for the write device.

8. The storage system according to claim 7, wherein the mid-level shifting means includes means for increasing the voltage swing of the received data signals.

9. The storage system according to claim 8, further comprising an output driver coupled to the mid-level shifting means for further increasing the voltage swing of the received data signals such that the voltage swing ranges from about ground level to about the positive supply voltage rail and for providing the data signals as outputs for an output driver device to drive write currents corresponding to the received data signals through the write head.

* * * * *